United States Patent [19]
Jarrige et al.

[11] Patent Number: 5,490,080
[45] Date of Patent: Feb. 6, 1996

[54] METHOD AND DEVICE FOR DECORATING A TRIDIMENSIONAL OBJECT

[75] Inventors: Marie C. Jarrige; Jean-Luc Jarrige, both of La Salvetat St. Gilles; Annie Delille, Blagnac; Vincent Lainez, Tournefeuille, all of France

[73] Assignee: Aerospatiale Societe Nationale Industrielle, Paris Cedex, France

[21] Appl. No.: 134,203

[22] Filed: Oct. 8, 1993

[30] Foreign Application Priority Data

Oct. 12, 1992 [FR] France .................... 92 12146

[51] Int. Cl.$^6$ .................... G06F 19/00; B05B 15/04
[52] U.S. Cl. .................... 364/468; 364/474.24; 118/301
[58] Field of Search .................... 364/468, 474.24, 364/472, 425; 395/119, 120; 118/301

[56] References Cited

U.S. PATENT DOCUMENTS

| | | | |
|---|---|---|---|
| 4,469,022 | 9/1984 | Meador | 364/468 |
| 4,845,634 | 7/1989 | Vitek et al. | 364/747.24 |
| 4,845,635 | 7/1989 | Rosselli | 364/468 |
| 4,862,377 | 8/1989 | Reedman et al. | 364/468 |
| 4,937,768 | 6/1990 | Carver et al. | 364/474.24 |
| 4,956,906 | 9/1990 | Masse et al. | 413/8 |
| 5,143,793 | 9/1992 | Masse et al. | 428/577 |

FOREIGN PATENT DOCUMENTS

| | | |
|---|---|---|
| 0198630A3 | 10/1986 | European Pat. Off. . |
| 0290809A3 | 11/1988 | European Pat. Off. . |
| 0371897A1 | 6/1990 | European Pat. Off. . |
| 0431239A1 | 6/1991 | European Pat. Off. . |

OTHER PUBLICATIONS

Computer–Aided Design, vol. 23, No. 8, Oct. 1991, London, GB pp. 583–592, B. K. Hinds et al "Pattern Development for 3D Surfaces".

*Primary Examiner*—Paul P. Gordon
*Attorney, Agent, or Firm*—Michael N. Meller

[57] ABSTRACT

Method and device for decorating a tridimensional object. The method consists of representing a three-dimensional model of the decorated object by a plotting of the decoration. It then consists of localizing on the object from the 3D model at least several characteristic points of said plotting so as to position, for example, adhesive decoration delimitation strips or stencils or precut decorative elements, etc. The invention is more particularly applicable to the decoration of an aircraft by logotypes, letters or distinctive signs on the outer surface of this aircraft.

15 Claims, 4 Drawing Sheets

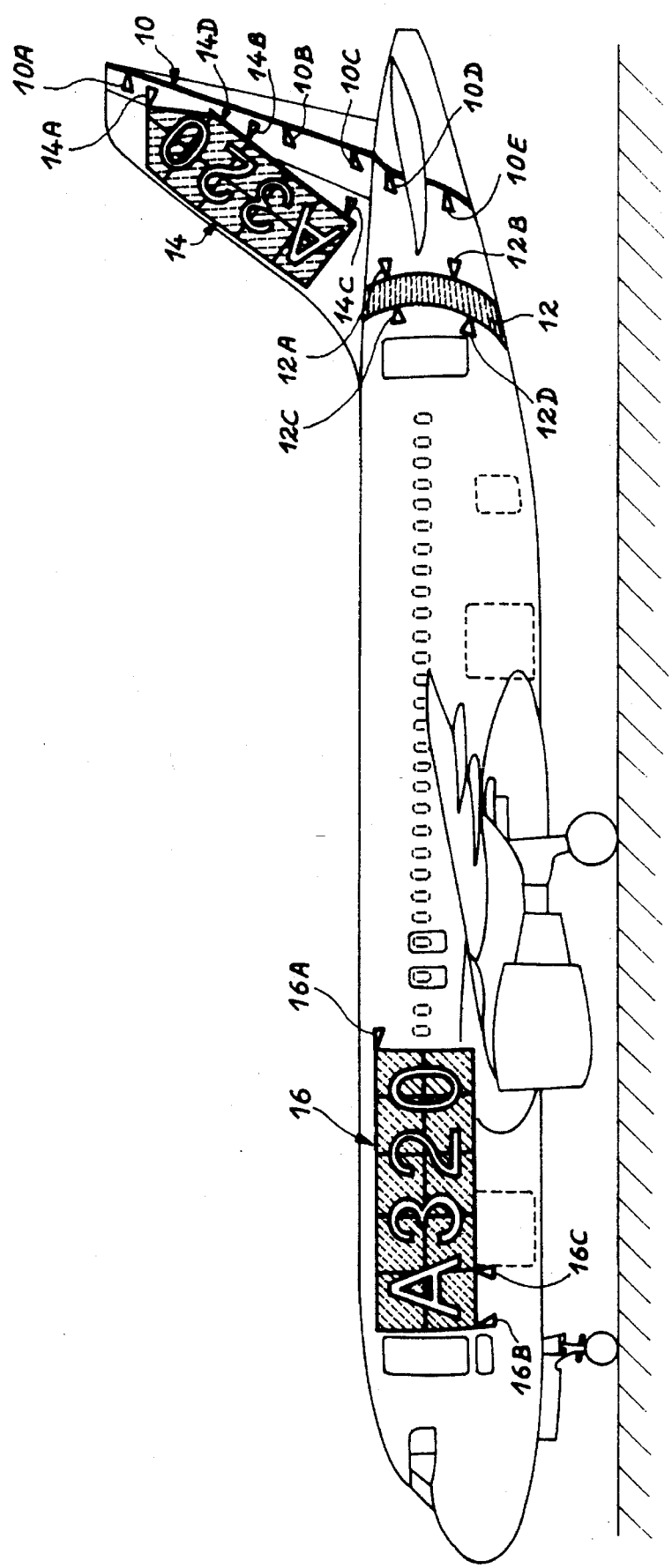

5,490,080

METHOD AND DEVICE FOR DECORATING A TRIDIMENSIONAL OBJECT

FIELD OF THE INVENTION

The invention concerns a method for decorating a tridimensional object and a device for implementing said method.

BACKGROUND OF THE INVENTION

It is more particularly applicable for decorating voluminous objects by logotypes, signs, letters or distinctive figures which can be painted on the surface of said objects and more particularly for the decoration of aircraft and especially the decoration of the outer surface of an aircraft by logotypes, signs, letters or distinctive figures selected by the air company operating said aircraft.

In the follolwing description, the invention shall be described concerning its application for decorating aircraft, this application not, however, being restrictive.

Generally speaking, the painting of aircraft consists of first of all applying sub-coats of protection paint and of then applying to these sub-coats a "background" paint, generally white. It is on this background paint that the logotypes, signs, figures or distinctive letters are to be applied as selected by the air company operating the aircraft in order to decorate the plane.

In order to protect its brand image, each airline company requires that an aircraft manufacturer provides suitable decoration, especially as regards all the distinctive logotypes and signs painted on the outer surface of the aircraft.

This outer decoration is generally embodied artistically and requires a series of extremely meticulous operations effected subsequent to the difficulties encountered by specialized decorators and painters for picturing in a three-dimensional space the aspect to be acquired by the logotypes, distinctive signs, etc., initially represented in two dimensions on the drawings. In fact, the airline company, the customer of the manufacturer, represents most of the time the desired two-dimensional decoration on a drawing. If a representation of the aircraft and its decoration are supplied to the manufacturer, they may only be approximative and in any event be unable to be used for being directly transferred onto the aircraft, even after being enlarged, due mainly to the fact that the choice of the dimensions and location of this decoration on the aircraft depend on the shape of this aircraft. Generally speaking, a definitive choice of decoration may only be carried out after the embodiment of a first decorative prototype on an aircraft; this prototype is subjected to various retouches which on each occasion require at least a partial rubbing out of the decoration. This process is long and costly, although the descriptive drawings of the decoration represented in two dimensions may be effected by means of CAD (Computer-Assisted Design) and the characteristic dimensions and positions of the decoration are defined by details on these drawings.

The drawings obtained by CAD are supplied to the airline company by the manufacturer or result from a collaboration between the airline company and the manufacturer. The obtaining of CAD drawings does not dispense with the need to embody a prototype decoration of a first aircraft, as well as the retouches mentioned earlier and the corrections of the initial drawings rendered necessary by these retouches. It is only when the airline company considers satisfactory the aspect of the prototype decoration that a definitive drawing can finally be validated.

Once the actual decorative prototype on an aircraft has been validated, a set of pouncing patterns (sheets pierced with marking holes) are noted on this aircraft so as to reproduce an identical decoration on the other aircraft of the airline company in question. Each pouncing pattern is constituted by a flat translucid film on which perforations are embodied and situated on the lines required for defining the decoration. Then marking means are used to position the pouncing pattern on the objects to be decorated. These marking means are references for positioning the pouncing patterns of each aircraft. They need to be positioned precisely with respect to the characteristic contours of the elements of the aircraft, for example the edges of the cabin windows or doors. The pouncing patterns are then filed and reused for the aircraft of a given type of a particular airline company.

The method described above has one major drawback: it is difficult to reproduce on a three-dimensional object a plotting embodied on a two-dimensional drawing. Another drawback results from the fact that the quality of the reading on a pouncing pattern of the validated decoration prototype of an aircraft conditions the quality of reproduction of the decoration on other aircraft.

Another drawback arises from the difficulty of fully plating a flat pouncing pattern on an open-ended support. Finally, the pouncing patterns, which frequently are always numerous and have large dimensions, present problems of archiving and need to be renewed after several usages.

A more recent method is able to automatically cut decoration stencils (sheet cut to the desired shape) intended to be applied to a tridimensional surface, such as the fuselage of an aircraft. The painting of the decoration, especially when a stencil is used, is generally effected with a gun. The cutting method consists of using a CAD processing system and CAD adapted program so as to obtain a tridimensional model representative of the outer surface of an aircraft to be decorated and a bidimensional model of an image of the decoration projected into an intermediate plane; the processing system and program are also able to position the bidimensional model with respect to positioning references concerning the tridimensional model. The method then consists of carrying out projection calculations so as to obtain a tridimensional representation of the decoration correctly positioned on the tridimensional model. The tridimensional representation data of the decoration and the aircraft are recorded. The processing system then controls means for cutting the stencils required for decoration and means for marking positioning references on said stencils.

The method described above also has a number of drawbacks:

Obtaining an acceptable stencil for decorating a first aircraft often results from the cutting of several stencils used for decorating tests on the aircraft, this proving to be expensive and time-consuming. Stencils like pouncing patterns need to be archived and be renewed after several usages, indeed after a single usage if these stencils are self-adhesive.

SUMMARY OF THE INVENTION

The aim of the present invention is to overcome the drawbacks, especially by avoiding the use of precut stencils which are costly to produce and involve time-consuming operations, especially as regards retouches.

More specifically, the invention concerns a method for decorating a tridimensional object and consisting of:

building a three-dimensional model of the decorated object by a plotting of the decoration and able to be displayed by at least one image;

of localizing on said object at least certain characteristic points of said plotting from the 3D model of the object and the plotting of the decoration, wherein it consists of modeling the decorated object:

by building a mathematical 3D image of the object to be decorated, this model being obtained from direct geometrical measurements of the object, the 3D model then able to be displayed by at least one image;

by superimposing on said model of the object at least one 3D mathematical model of the plotting of the desired decoration of the object able to be displayed by at least one image.

According to a further characteristic of the invention, the method consists of positioning on the object decoration delimitation means from said characteristic points localized on the object.

In particular, the invention makes it possible to carry out direct retouches of the image of the decoration on that of the object displayed tridimensionally.

The invention also concerns a device able to implement said method. This device is characterized in that it comprises:

a data processing system controlled by a specialized CAD software so as to obtain a tridimensional representation of a model of the object to be decorated and a tridimensional representation of a model of the plotting of the desired decoration of the object, the model of the plotting being superimposed on the model of the object;

storage means connected to the processing system so as to record the coordinates of at least a plurality of the characteristic points of the plotting of the decoration marked with respect to reference points of the object;

means to localize on said object at least the characteristic points of the plotting of the decoration.

In fact, this localization consists of projecting to natural size onto the object an image of the plotting of the decoration represented in full or at least by a plurality of the characteristic points of this plotting. Luminous projection means may be used. Of course, they require an initial position and orientation adjustment.

According to a further characteristic of the device, the luminous projection means comprise a luminous source and means for controlling the displacement and orientation of the luminous source for projecting onto the object said characteristic points of the plotting on the basis of said recorded coordinates.

According to another embodiment of the device, the luminous source displacement and orientation control means are connected to the processing system.

According to one embodiment variant, the luminous source is a laser source.

According to another embodiment variant, the device comprises a device for projecting images of the decoration onto the object.

According to another characteristic, the device comprises decoration delimitation means positioned on the object on the basis of the positions of said index or position finding marks.

According to one particular characteristic, said decoration delimitation means are adhesive strips or stencils.

According to another particular characteristic, said decoration delimitation means are self-adhesive elements.

According to one embodiment variant, the means to localize said characteristic points on said object are means for projecting the decoration image onto said object.

According to another characteristic, the means to localize the plotting of the decoration on said object comprise a device for cutting a sensitive film adhering to the object so as to have appear zones of this film corresponding to the decoration zones, said zones of the sensitive film being peelable.

According to another embodiment variant, the device comprises a robot for distributing a polymerisable material in the form of a film for masking the surface of said object, this film delimiting the decoration and the robot being controlled by said processing system.

Finally, according to another embodiment variant, the device comprises a robot controlled by the processing system so as to lay down strips, stencils or adhesive indices for marking or delimiting the decoration.

BRIEF DESCRIPTION OF THE DRAWINGS

The characteristics and advantages of the invention shall appear more readily from a reading of the following illustrative non-restrictive description with reference to the accompanying drawings on which.

DETAILED DESCRIPTION OF THE PREFERRED EMBODIMENTS

Figure 1:
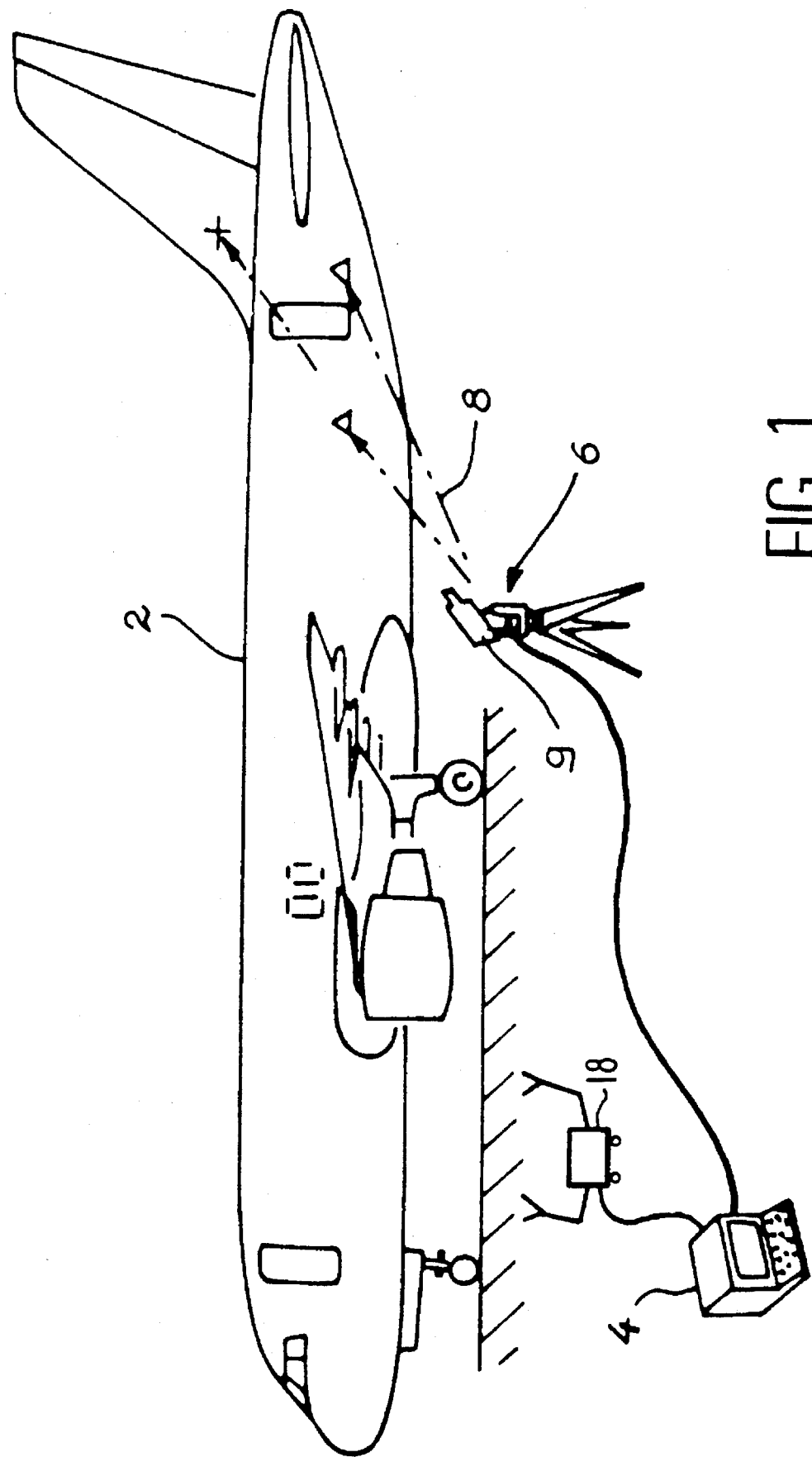
FIG. 1 is a diagrammatic view of the device for implementing the method of the invention.

FIG. 1 diagrammatically shows an embodiment of the device of the invention, said embodiment mainly including a laser beam 8 range finder 6 connected to a data procesing system 4. This range finder 6, as shall be seen subsequently in detail, is used by means of its beam marking to localize points on an aircraft 2; these points then make it possible to accurately position the delimitation means and in particular the masks, strips or stencils for delimiting the desired decoration which is carried out, for example, by applying one or several paints of various colors in the delimited zones.

The range finder used is of a known type and shall not be described here in detail. In particular, it comprises a telescopic lens (not shown on the figure) able to make observations with a view to initially adjusting the range finder with respect to reference marks linked to the aircraft. It is this adjustment which then makes it possible to accurately carry out the projection onto the aircraft of the plotting of the decoration or marking characteristic points of this plotting. The laser source of the range finder emits a laser beam 8 whose impact on the aircraft is a characteristic point of the plotting of the decoration. As shall be seen subsequently in detail, the coordinates of each characteristic point have been determined by the processing system 4 using CAD data. These coordinates are determined in a reference mark. The coordinates are recorded in a memory of the processing system. The processing system 4 shall not be described here in detail. For example, it comprises a microprocessor with a screen and a control keyboard. Other embodiments of the device of the invention shall be described later in detail.

Figure 2:
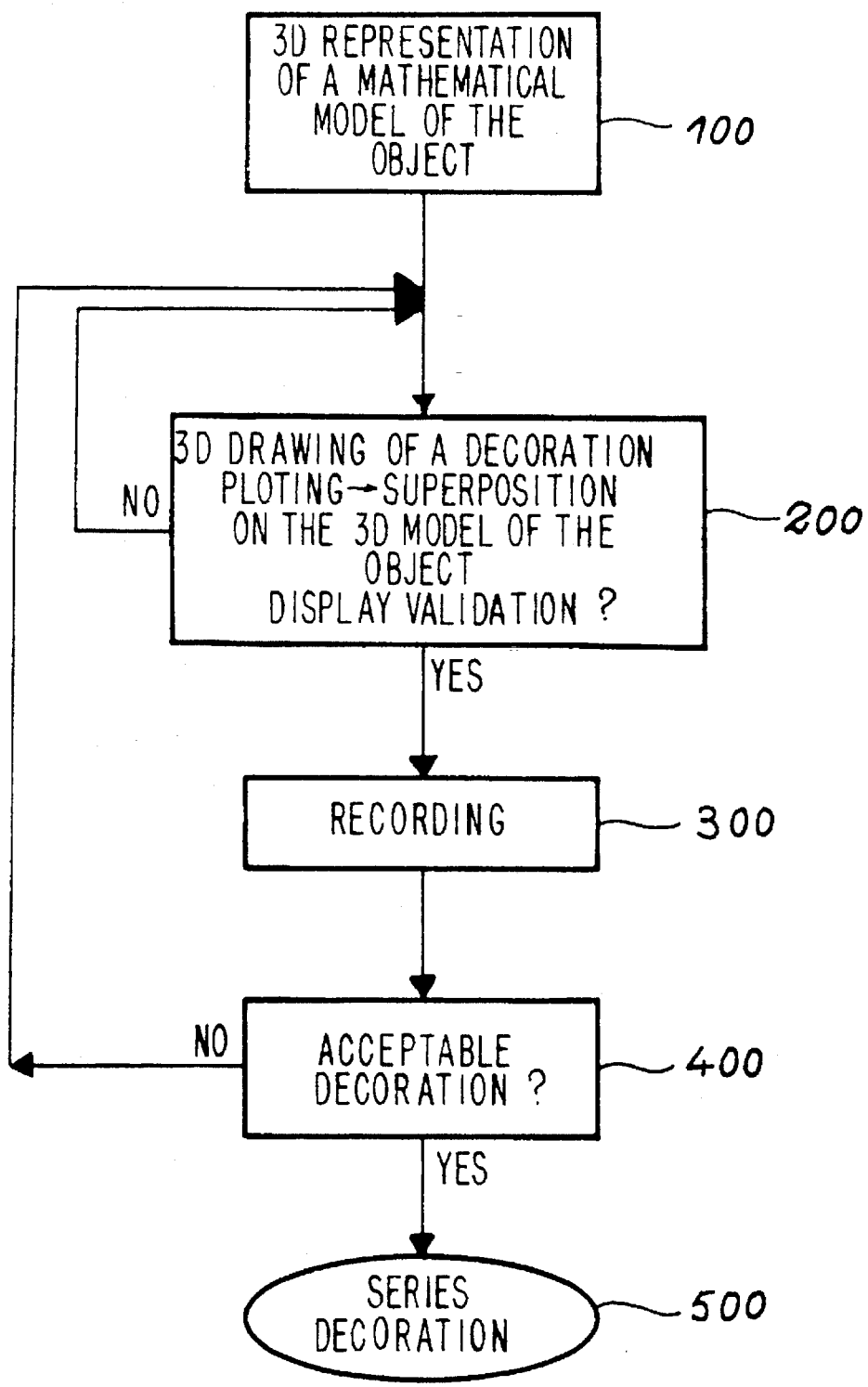
FIG. 2 is a flowchart representing the main stages of the method of the invention.

FIG. 2 is a flowchart showing the main stages of the method of the invention. The details concerning these main stages are to be given later in detail.

This method comprises a stage 100 which consists of setting up a 3D data processing file for defining a mathematical or virtual model of the aircraft to be decorated. The data of this file are established from specialized "surface modeling" or "solid modeling" software as relating to the surface or volume of the object. This software is sold, for example, under the AEROLLS or CATIA brands. This file shall also contain marking reference data so as to be able to correctly define the plotting of the decoration and its positioning on the aircraft. The 3D file for defining the model of the aircraft to be decorated may be constituted from files derived from various partners having taken part in defining and manufacturing the aircraft. It may also be established by geometrical measurements on the aircraft, for example with the aid of a meter rule or by means of metrophotography. The next stage 200 consists of drawing up a 3D mathematical model of the plotting of the decoration with the aid of a specialized software which may be one of the items of software mentioned earlier.

Images of the decorated aircraft may then be obtained by data processing means on the display screen of the processing system 4 (FIG. 1). This displaying operation is a simulation of the image of the decorated aircraft.

After they have been validated by the airline company, the data of this model of the plotting of the decoration are entered into a file which gives a three dimensional precise decoration. The obtaining of this 3D file of a model of the decoration shall be described later in detail. Once the 3D file of a decoration model has been set up, the stage 200 then consists of superimposing the 3D model of the plotting of the decoration on the 3D model of the aircraft to be decorated. This superimposition uses the positioning reference data contained in the 3D file of the model of the aircraft. The file obtained is then a 3D file of the decorated aircraft.

As shall be seen later in detail, the obtaining of a 3D file of the decoration may be the result of a processing of a 2D file of the decoration shown on the drawing.

The surface and solid CAD software products (3D) are unable to directly modify the plotting of a CAD obtained curve on a CAD obtained surface.

So as to carry out this modification, it is necessary to position a point on the surface and then bend in the curve so that it passes through this point. Having regard to the shapes of the surface of an aircraft, there is nothing to indicate that the new curve by CAD means is continuously in contact with the surface of the aircraft obtained by CAD means. It is then necessary to project this new curve onto the surface. It is then certain that the displayed curve is fully placed on the surface of the 3D model.

The airline company has defined the decoration inside a 2D plane. This definition is not fully satisfactory as it is given inside a plane and is not the result of projections. Thus, it is not certain that the plotting of the decoration on the aircraft clearly corresponds to the desires of the airline company. The projection method described above may thus give a result not exactly expected by the representative of the airline company when the decoration is implemented to natural size on the aircraft.

So as to overcome these drawbacks, the stage 200 may comprise two additional operations.

One of these operations consists of using a software, such as the one known and sold under the brand CDRS, which is able to manipulate curves attached to surfaces. By means of this type of software, it is possible to optimize the projection of curves onto surfaces by visual control from predetermined projection points. This optimization makes it possible to ensure the harmonization and visual continuity of the curves concerning the highly open-ended portions of the surface of the aircraft and especially concerning the interfaces between various open-ended portions or between open-ended and flat portions (for example, the rear cone of the aircraft, the rudder unit, the front nose cone, etc).

This displaying of the image of the decorated aircraft may be improved at any time by using synthesis images enabling a realistic presentation of the decorated aircraft to be submitted to the airline company.

The subsequent operation for validating the decoration is thus significantly simplified.

When the decoration is validated (response YES to question 200), its plotting is recorded by the stage 300 by the processing system in a memory in the form of a data processing file. This file contains data relating to the surfaces of the aircraft, the plotting of the decoration and in particular contains data corresponding to the relative positions of the plotting and surface.

As long as the plotting of the decoration has not been validated (response NO to the question 200), the recording is not carried out and the plotting may be modified, as described earlier.

So as to facilitate the positioning and subsequent adjustment, for example, of precut masks delimiting the painting of the decoration of the aircraft or the positioning of self-adhesive elements to be described later, the data processing file may also contain positioning data relating to the location of doors, cabin windows, joints, air inlets and other elements visible on the aircraft.

The data recorded in the data processing file are basically coordinates of points of the plotting of the decoration and points of the surface of the aircraft measured in a given reference mark linked to the aircraft.

After the recording carried out in the stage 300, the next stage 400 consists, by means of means to be described later in detail, of embodying a first prototype decoration on an aircraft by using the decoration positioning and delimitation data contained in the data processing file set up during the stage 300. If this real decoration is accepted (reply YES to the question 400), the data of the file are validated and may be used for decorating a series of aircraft of the same type belonging to the airline company concerned (stage 500). If the actual decoration is not accepted (reply NO to the question 400), it is neccesary to modify the contents of the file by reverting to stage 200. The data relating to the modifications resulting from retouches of the prototype of the decoration on the actual aircraft are of course modified so as to update the file.

The setting up of the 3D file of the decoration in stage 200 includes a prior phase for designing or defining the decoration.

On the basis of the desires of the airline company, the definition of the decoration may be established, either from a drawing or a plotting of the decoration inside a two-dimensional plane (via a 2D CAD application, for example), or via synthesis images. Irrespective of the selected mode of definition, each of them can be used as a basis for validating the decoration by the airline company.

If the decoration is plotted on a drawing, a paper medium is used. This drawing may also be obtained at the outlet of a printer connected by CAD to a processing system. Several drawings may be required to represent front, profile, underneath views, etc., of the decorated aircraft. Additional information is added, such as dimensions, color references, etc.

If the decoration is effected by CAD means, a software is able to obtain synthesis images under all the angles of an undecorated aircraft. The operator is able to directly represent the curves of the decoration on the surface of the aircraft: plotting of strips, use of patterns derived from a library or obtained by any other acquisition method (scanner, photo, video, etc).

The software is also able to embody projections of the decoration with respect to fictive observation points qualified with control points from which the patterns of the decoration shall have a predefined aspect.

The advantage of this representation is to obtain the effect the real decoration is to have on the aircraft. Accordingly, this resolves all problems relating to optical illusion and uncertainty two-dimensional views so as to reduce disputes with the customer company. When the decoration defined is validated by the company, it is then necessary to enter the details of this decoration in the data processing file (standard file obtained from a CAD software) which gives a precise definition of the (3D) three-dimensional decoration.

The painting of the decoration is applied to an aircraft which is a relief support and the 3D file is essential to control an accurate decoration tool. This tool is able to faithfully reproduce the selected decoration and avoids any plotting errors due to the paint interpreting 2D planes with insufficient information.

The 3D file shall contain:

data relating to adjustment points able to make the referential system (XYZ) of the data processing file coincide with the surface of the actual aircraft;

the plotting of decorations.

Three methods may be used separately or jointly so as to obtain the 3D file of the decoration plotting from three different sources:

A—From the 2D plane:

If the decoration has been selected and validated from CAD or 2D paper drawings, it is necessary to set up a 3D file by projecting onto the surfaces of the aircraft the decoration patterns and strips described on the drawing.

Thus, it is necessary to firstly have available a CAD file (3D) of the data relating to the geometry of the external surfaces of the aircraft (surface or volume CAD).

Figure 3:
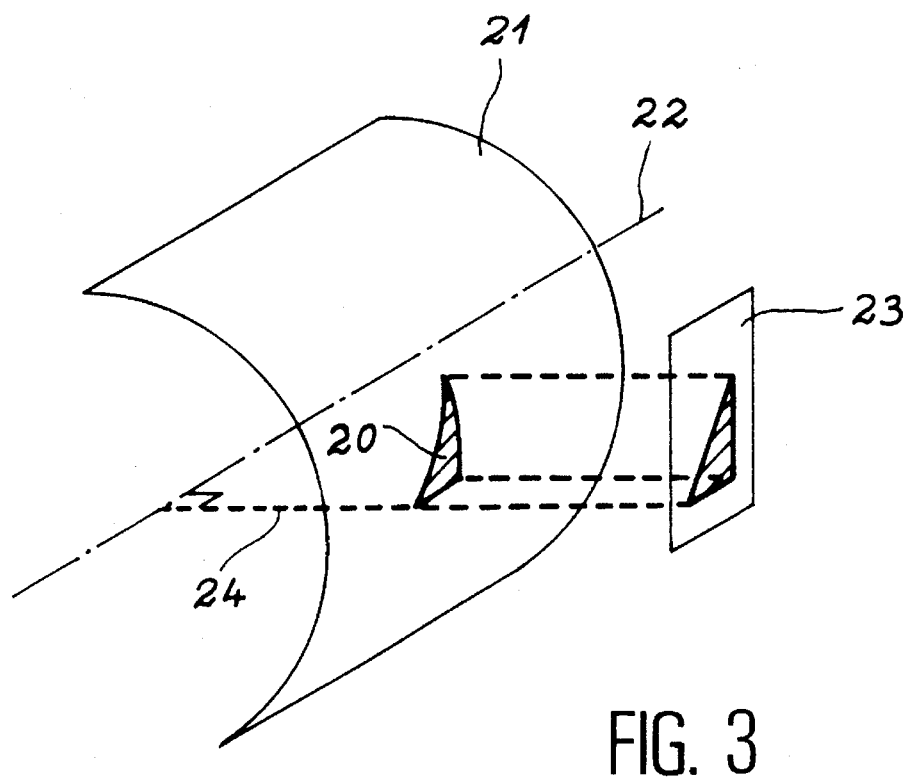
FIGS. 3 and 4 are shown to explain in more detail the operations to be carried out during the stages of the method of the invention, and FIG. 5 diagrammatically represents the fuselage of an aircraft being decorated.

The data processing projection (that is, CAD effected and appearing on the display screen of a processing system) of patterns of the decoration onto the surface of the aircraft shall use a particular methodology:

Concerning the flat portions or those with a slightly open-ended shape (rudder unit, fuselage cylinder, for example) as shown on FIG. 3, it is possible to normally use an orthogonal projection. The plotting of the pattern 20 of the decoration onto the surface 21 of the aircraft (for example, the fuselage having an axis of symmetry 22) is the intersection of a vertical plane 23 where the pattern is plotted with the surface 21 of the aircraft (3D surface) along a direction 24 perpendicular to the axis 22 of the aircraft.

Concerning the open-ended portions (rear cone, radome, etc.), the orthogonal projection described above is not satisfactory, the decoration obtained on the actual aircraft not possessing the sought-after aspect. In fact, the patterns of the decoration appear deformed on account of the curve of the surfaces on which they are plotted.

Thus, a strictly horizontal line on the rear cone appears plunging.

It is essential that the patterns of the decoration are visible for an observer located at a predetermined visual control point as they are plotted on a drawing.

Figure 4:
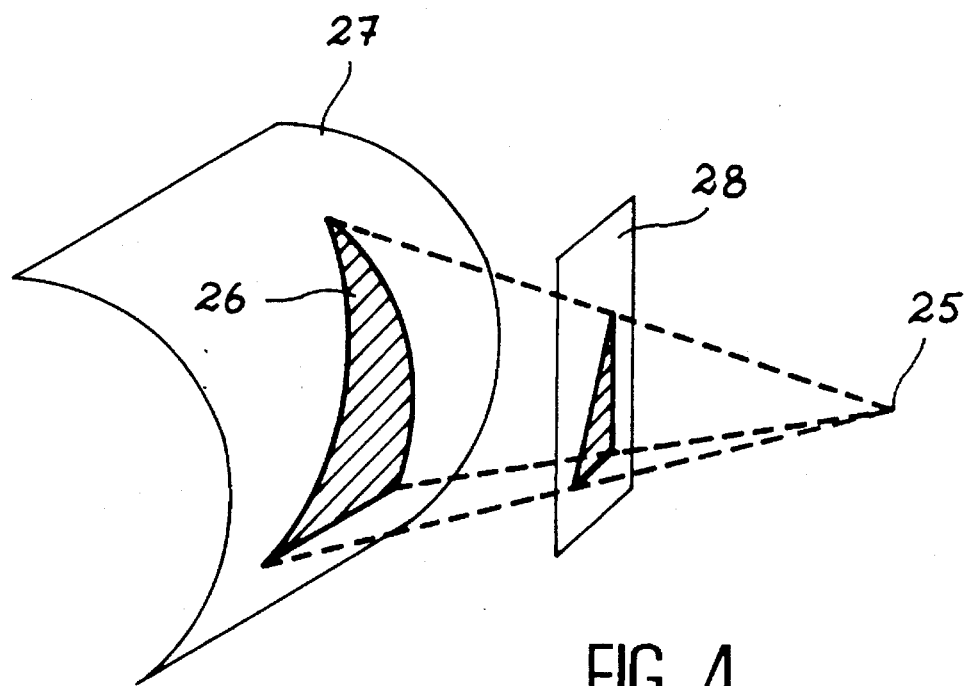

So as to obtain the 3D file corresponding to this requirement, it is necessary, as shown on FIG. 4, to use conical projections derived from the observation point 25. In this case, the eye functions in the way of a lens where the focal point is the retina. The observer sees the pattern 26 of the decoration plotted on the surface 27 of the aircraft on the basis of the 3D file obtained by this method so that this pattern appears inside the plane 28 with focussing and synthesis image validation.

B—From the already decorated actual aircraft:

When an aircraft is already decorated and the decoration has been accepted by the airline company, this decoration can be used as a model for other aircraft of the same type from the same company. It is then possible to use metrophotography or the 3D meaurement by means of a theodolite so as to make readings enabling the decoration 3D file to be established. Metrophotography uses photographs of targets glued to the aircraft, whereas measurement by theodolite uses sighting intersections.

These two methods make it possible to obtain a data processing file of the coordinates x, y and z of points which enable the decoration positioning or delimitation to be marked on the aircraft.

The main advantage of this method is that the 3D decoration file corresponds to the requirements of the airline company since it is derived from a decorated and validated aircraft.

C—From a 3D pattern by means of a direct drawing:

With the aid of the processing system, it is possible to directly, without making use of the 2D drawing, to design plottings and images so as to subsequently submit the decoration draft to the customer company.

According to the invention, the embodiment of a prototype decoration on the actual aircraft may then be carried out as follows: the characteristic points of the decoration plotting are projected onto the surface of the aircraft by optical means. The coordinates of these characteristic points have been stored as described earlier in the data processing file. This projection is effected by using, for example, the laser range finder 6 of FIG. 1 after an initial adjustment with the aid of an observation lens, as indicated earlier.

The coordinates of the characteristic points determined and recorded by the processing system 4 may, according to an operational mode of the method, be read on a screen of the processing system. These coordinates may also be recorded in a memory belonging to the range finder. In this mode of operation, an operator situated close to the laser range finder 6 manually orientates the range finder by using incorporated adjustment means so that the impact of the beam of the range finder onto the aircraft is a point whose coordinates correspond to those read on the screen and which correspond to a characteristic point of the plotting.

According to another mode of operation, the observation is automatic. The range finder then comprises means for controlling the movement and orientation of the luminous source, said means being connected to the processing system. These means control the automatic orientation of the laser beam so that it is directed towards the characteristic points of the plotting which need to be marked on the aircraft. The orientation and movement control means are known to exist in the prior art and are not shown on FIG. 1. Each point of impact of the beam of the range finder on the aircraft may be selected by the operator, for example by means of remote control able to indicate the number of the point it is desired to be displayed. Advantageously, it is possible to mark points spaced, for example by thirty centimeters, on the flat surfaces of the aircraft, and ten centimeters when the surfaces targetted by the beam of the range finder are open-ended.

So as to carry out this luminous projection, it is necessary to define the adjustment points of the range finder, as well as the working zones on the aircraft. In fact, there is frequently a geometry discrepancy between the theoretical model and the actual aircraft. So as to get rid of this discrepancy, each luminous projection is limited to successive working zones with relatively restricted dimensions and which may be assimilated with non-deformed zones.

For each working zone, the operator marks one by one the characteristic points of the decoration plotting on the aircraft. The marking of these points makes it possible to position a mask or precut adhesives delimiting the letters, distinctive signs, logotypes, etc., constituting the decoration.

After positioning masks or precut adhesives, the decoration of the aircraft is carried out by painting the delimited decoration zones. Once a first aircraft has been decorated, it is submitted for approval by the airline company. When the decoration of the first aircraft has been accepted, the other aircraft of the same type of the airline company may then be decorated in series according to the same methods by using the data stored in the data processing film. Otherwise, the method is resumed, as indicated earlier in stage 200, by taking account of those modifications desired by the airline company. This case is nevertheless less likely to arise as the plotting of the decoration has been previously approved and it is scarcely conceivable that the effect of the decoration obtained by displaying on the screen of a processing system differs from the real effect obtained on the aircraft.

FIG. 5 shows examples of decoration plottings on an aircraft. According to the invention, several possibilities are available so as to delimit and obtain a decoration on the fuselage of the aircraft.

The first example consists of marking characteristic points by adhesive indices or erasable marks 10a, 10B, 10C, 10D and 10E. These characteristic points are then connected by a strip or adhesive band 10 so as to obtain a decoration delimitation line. This possibility is mainly used when the decoration only comprises decorative strips or decorative figures with simple shapes. Nevertheless, this decoration delimitation line may also be used as a marking line so as to position a delimitation mask of the painting of the decoration, said mask being fixed by the adhesive strip 10.

Another possibility consists of applying a self-adhesive decorative element 12 whose location is determined by adhesive indices 12A, 12B, 12C, 12D positioned with the aid of the range finder. The self-adhesive elements may be precut. For example, they represent the complex attributes identifying the airline company (letters, logotypes, etc.), technical markings, etc. Another possibility consists of localizing a stencil 14 by means of adhesive indices 14A, 14B and 14C whose positions are marked with the aid of the range finder. The localization of this stencil is carried out after firstly positioning an adhesive strip 14D.

Finally, another possibility also consists of localizing a stencil 16 by means of adhesive indices 16A, 16B, 16C whose positions are marked by the range finder.

According to another embodiment of the device of the invention, the latter further comprises a device 9 for projecting images of the decoration and coupled to the range finder 6 (FIG. 1). This projection device may be a video type device. It projects onto the aircraft an image of the decoration to natural size. This image is obtained from data relating to the decoration synthesis image recorded in the data processing file described earlier. The position and projection direction of the image of the decoration to natural size on the aircraft are determined by a laser range finder. So as to limit the deformation of the projected image of the decoration onto the aircraft, especially onto open-ended surfaces, the projection may be carried out along successive portions of decoration images.

The projected image of the decoration is able, for example, to plot the contours of this decoration on the aircraft.

The placing of adhesive bands, strips, indices or stencils mentioned earlier may also be carried out by a robot with a handling arm. The movement of the robot around the aircraft and the positions of the arm are localized with respect to a reference mark linked to the aircraft and controlled by the processing system from the data recorded in the data procesing file. The robot may also place a masking film delimiting the zones to be painted. This film may be constituted by an adhering polymer material delivered by a distributor whose flowrate is quantified so that polymerization occurs gradually as the distributor moves forwards.

It is also possible to use a "peelable" mask constituted by a sensitive film adhering to the object and cut by the laser beam adapted to this function and guided by the range finder so as to delimit the plotting of the decoration. The cutting of the sensitive film makes it possible to remove the sensitive films zones corresponding to the zones to be painted so as to obtain the decoration, whilst leaving in place the protective sensitive zone and thus allow paint to be applied. The protective film is then removed when the paint drying cycle has ended.

The method and device described above may of course be applied to the decoration of any object other than an aircraft.

What is claimed is:

1. Method for decorating a tridimensional object consisting of:

constructing a three-dimensional model of the object to be decorated by plotting of a desired decoration, said plotting being displayed by at least one image;

localizing on said object at least certain characteristic points of said plotting from the model of the object and the plotting of the decoration, and modeling the decorated object comprising constructing a 3D mathematical model of the object to be decorated by means of a surface or volume type Computer Assisted Design (CAD), this model of the decorated object being able to be displayed by at least one image;

superimposing on said model of the object at least one 3D mathematical model of the plotting of said desired decoration of the object, said plotting being displayed by at least one image and using positioning means on the object for delimiting the decoration on the object, from said characteristic points localized on the object.

2. Method according to claim 1, wherein the 3D mathematical model of the object to be decorated is obtained from direct geometrical measurements of the object.

3. Device for decorating a tridimensional object, comprising:

a data processing system controlled by a specialized Computer Assisted Design software so as to obtain a tridimensional representation of a mathematical model of the object to be decorated by plotting a desired decoration and a tridimensional representation of a mathematical model of said plotting of said desired decoration of the object, the model of the decoration plotting being superimposed on the model of the object;

storage means connected to the processing system so as to record the coordinates of at least a plurality of characteristic points of the plotting of the decoration and marked with respect to reference points of the object; and means to localize on said object at least the characteristic points of the plotting of the decoration from said recorded coordinates.

4. Device according to claim 3, further comprising a robot controlled by the processing system so as to lay down strips, stencils or adhesive indices for marking or delimiting the decoration.

5. Device according to claim 3, wherein the means to localize said characteristic points on said object are means for producing a luminous projection of said points onto said object.

6. Device according to claim 5, wherein the luminous projection means comprise a luminous source and means for controlling the movement and orientation of the luminous source so as to project onto the object said characteristic points of the plotting on the basis of said recorded coordinates.

7. Device according to claim 5, wherein the luminous source is a laser source.

8. Device according to claim 6, wherein the means for controlling the movement and orientation of a luminous source are connected to the processing system.

9. Device according to claim 5, further comprising adhesive indices or erasable marks so as to mark said characteristic points localized on the object by means of luminous projection.

10. Device according to claim 9, further comprising means for delimiting the decoration positioned on the object from the positions of said marking marks or indices.

11. Device according to claim 10, wherein said decoration delimiting means are adhesive strips or stencils.

12. Device according to claim 10, wherein said decoration delimiting means are self-adhesive elements.

13. Device according to claim 3, wherein the means to localize said characteristic points on said object are means for projecting an image of the decoration onto said object.

14. Device according to claim 3, wherein the means to localize the plotting of the decoration on said object comprise a device for cutting a sensitive film adhering to the object so as to delimit zones of this film corresponding to the decoration, said delimited zones of the sensitive film being peelable.

15. Device according to claim 4, further comprising a robot for distributing a polymerizable material in the form of a masking film on the surface of said object, this film delimiting the decoration and the robot being controlled by said processing system.

* * * * *